United States Patent
Sze

(10) Patent No.: US 11,233,501 B1
(45) Date of Patent: Jan. 25, 2022

(54) SIGNAL TRANSMISSION CIRCUIT AND POWER SUPPLY LINE

(71) Applicant: Chun Kuen Sze, Hong Kong (HK)

(72) Inventor: Chun Kuen Sze, Hong Kong (HK)

( * ) Notice: Subject to any disclaimer, the term of this patent is extended or adjusted under 35 U.S.C. 154(b) by 0 days.

(21) Appl. No.: 17/242,252

(22) Filed: Apr. 27, 2021

Related U.S. Application Data

(63) Continuation of application No. PCT/CN2021/071605, filed on Jan. 13, 2021.

(30) Foreign Application Priority Data

Dec. 18, 2020 (CN) .......................... 202011508308.9

(51) Int. Cl.
*H03K 5/00* (2006.01)
*H03K 5/01* (2006.01)
*H03K 5/13* (2014.01)
*H03K 19/0175* (2006.01)
*H03K 5/15* (2006.01)

(52) U.S. Cl.
CPC .................. *H03K 5/01* (2013.01); *H03K 5/13* (2013.01); *H03K 5/15* (2013.01); *H03K 19/0175* (2013.01)

(58) Field of Classification Search
None
See application file for complete search history.

(56) References Cited

U.S. PATENT DOCUMENTS

| | | | | |
|---|---|---|---|---|
| 2011/0266874 | A1* | 11/2011 | Soemantri | G06F 1/325 307/66 |
| 2013/0278069 | A1* | 10/2013 | Amei | G05F 1/462 307/103 |
| 2014/0347008 | A1* | 11/2014 | Chae | H02J 7/00711 320/108 |
| 2015/0049833 | A1* | 2/2015 | Noguchi | H04B 5/0075 375/272 |
| 2019/0268038 | A1* | 8/2019 | Gerwig | H04L 12/40045 |
| 2020/0007190 | A1* | 1/2020 | Ding | H04B 3/54 |
| 2021/0168913 | A1* | 6/2021 | Lula | H05B 45/14 |

\* cited by examiner

Primary Examiner — Tuan T Lam

(57) ABSTRACT

A signal transmission circuit is connected to a positive electrode of a direct current power supply line, the signal transmission circuit includes a modulation circuit and/or a demodulation circuit, the modulation circuit includes a modulation chip, the modulation chip is used to receive an input signal, generate a modulation signal according to the input signal, and output the modulation signal through the positive electrode of the power supply line; the demodulation circuit includes a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal.

12 Claims, 2 Drawing Sheets

SIGNAL TRANSMISSION CIRCUIT AND POWER SUPPLY LINE

CROSS REFERENCE TO RELATED APPLICATIONS

The present application is a Continuation Application of PCT Application No. PCT/CN2021/071605 filed on Jan. 13, 2021, which claims the benefit of Chinese Patent Application No. 202011508308.9 filed on Dec. 18, 2020. All the above are hereby incorporated by reference in their entirety.

TECHNICAL FIELD

The present application relates to the field of signal transmission technology, and specifically relates to a signal transmission circuit, a power supply line and a device.

BACKGROUND TECHNOLOGY

At present, with the continuous development of smart home technology, more and more smart home devices appear in people's daily life.

However, in the existing smart home devices, the power supply line and the signal line are provided separately, resulting in a relatively complex circuit in the smart home devices.

In summary, the problem in the existing technology is that the circuit in the smart home devices is relatively complex.

CONTENTS OF THE INVENTION

One of the objectives of the present application is to provide a signal transmission circuit, a power supply line and a device to solve the problem in the existing technology that the circuit in the smart home devices is relatively complex.

In order to achieve the above objective, the technical scheme adopted in an embodiment of the present application is as follows:

In a first aspect, an embodiment of the present application provides a signal transmission circuit, the signal transmission circuit is connected to a positive electrode of a direct current power supply line, the signal transmission circuit includes a modulation circuit and/or a demodulation circuit, wherein, the modulation circuit includes a modulation chip, the modulation chip is used to receive an input signal, generate a modulation signal according to the input signal, and output the modulation signal through the positive electrode of the power supply line;

the demodulation circuit includes a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal.

In a possible embodiment, the modulation circuit further includes a signal output unit, the signal output unit is connected to an output end of the modulation chip, the signal output unit is used to couple the modulation signal transmitted from the modulation chip to the positive electrode of the power supply line.

In a possible embodiment, the signal output unit includes a first resistor and a first capacitor, the first resistor is connected in series with the first capacitor and then connected to the output end of the modulation chip and the positive electrode of the power supply line respectively.

In a possible embodiment, the demodulation unit includes a demodulation module, a buffer module and a reference voltage supply module, the demodulation module is connected to the buffer module and the reference voltage supply module respectively, the buffer module is connected to the reference voltage supply module; wherein, the reference voltage supply module is used to provide a reference voltage for the demodulation module and the buffer module.

In a possible embodiment, the demodulation module includes a first diode, a first discharge loop and a first comparator, the first diode is connected to the direct current isolation unit, the first discharge loop and an inverting input end of the first comparator respectively, the first diode is used to rectify a signal transmitted from the direct current isolation unit, a non-inverting input end of the first comparator is connected to the reference voltage supply module, an output end of the first comparator is connected to the buffer module.

In a possible embodiment, the first discharge loop includes a second capacitor and a second resistor, one end of the second resistor is connected to the first diode, another end of the second resistor is grounded; one end of the second capacitor is connected to the first diode, another end of the second capacitor is grounded.

In a possible embodiment, the reference voltage supply module includes a second diode and a second discharge loop, the second diode is connected to the second discharge loop and the direct current isolation unit respectively, the second discharge loop is further connected to the non-inverting input end of the first comparator; wherein, the discharge time of the second discharge loop and the discharge time of the first discharge loop are different.

In a possible embodiment, the second discharge loop includes a third capacitor, a third resistor and a fourth resistor, one end of the third capacitor is connected to the second diode and the third resistor, another end of the third capacitor is grounded, one end of the third resistor is connected to the second diode, another end of the third resistor is connected to the non-inverting input end of the first comparator and one end of the fourth resistor respectively, another end of the fourth resistor is grounded.

In a possible embodiment, the buffer module includes a second comparator, the reference voltage supply module includes a voltage division circuit, a non-inverting input end of the second comparator is connected to the output end of the first comparator, an inverting input end of the second comparator is connected to the voltage division circuit, and the voltage division circuit is further connected to a power supply.

In a possible embodiment, the voltage division circuit includes a fifth resistor and a sixth resistor, one end of the fifth resistor is connected to the power supply, another end of the fifth resistor is connected to one end of the sixth resistor and the inverting input end of the second comparator respectively, another end of the sixth resistor is grounded.

In a possible embodiment, the direct current isolation unit includes a direct current isolation capacitor.

In a possible embodiment, the direct current isolation unit includes a transformer.

In a second aspect, an embodiment in the present application further provides a power supply line, the power supply line includes the above-mentioned signal transmission circuit.

In a third aspect, an embodiment in the present application further provides a device, the device includes the above-mentioned signal transmission circuit.

The present application has the following beneficial effects compared to the existing technology:

The embodiments in the present application provide a signal transmission circuit, a power supply line and a device, the signal transmission circuit is connected to a positive electrode of a direct current power supply line, the signal transmission circuit includes a modulation circuit and/or a demodulation circuit, wherein, the modulation circuit includes a modulation chip, the modulation chip is used to receive an input signal, generate a modulation signal according to the input signal, and output the modulation signal through the positive electrode of the power supply line; the demodulation circuit includes a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal. Due to the adoption of a power supply line to realize signal transmission, therefore it is not necessary to have an additional signal line, making the circuit between devices simpler.

DESCRIPTION OF DRAWINGS

In order to more clearly explain the technical scheme of the embodiments of the present application, the drawings to be used in the embodiments will be briefly introduced below. It should be understood that the following drawings show only some of the embodiments of the present application, and therefore they should not be regarded as a limitation of the scope, as a person with ordinary technical skill in the art can also obtain other relevant drawings according to these drawings without creative labour.

Symbols in the drawings.

Figure 1:
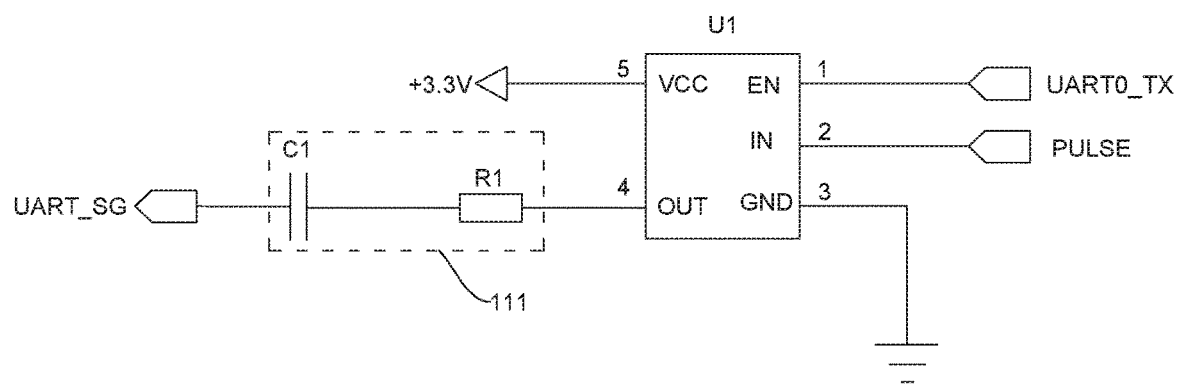
FIG. 1 is a circuit diagram of a modulation circuit provided in an embodiment of the present application.

110—modulation circuit; 111—signal output unit; U1—modulation chip; R1—first resistor; C1—first capacitor; 200—demodulation circuit; 210—direct-current isolation unit; 220—demodulation unit; 221—demodulation module; 222—buffer module; 223—reference voltage supply module; BP1—first diode; 2211—first discharge loop; U2—first comparator; R2—second resistor; C2—second capacitor; U3—second comparator; BP2—second diode; 2231—second discharge loop; C3—third capacitor; R3—third resistor; R4—fourth resistor; 2232—voltage division circuit; R5—fifth resistor; R6—sixth resistor; R7—isolation resistor.

SPECIFIC EMBODIMENTS

In order to make the purpose, technical scheme and advantage of the embodiment of this application clearer, the following will be combined with the drawings in the embodiment of this application. The technical scheme in the embodiment of this application will be clearly and completely described. Obviously, the embodiment described is part of the embodiments of this application, and not all of the embodiments. The components of the embodiment of this application, which is usually described and shown in the drawings, can be arranged and designed in a variety of different configurations.

Therefore, the following detailed description of the embodiment of this application provided in the drawings is not intended to limit the scope of protection of the application, but merely to represent the selected embodiment of the application. Based on the embodiment in this application, all other embodiments obtained by a person with ordinary technical skill in this art without creative labour shall fall within the scope of protection of this application.

It should be noted that similar symbols and letters represent similar elements in the drawings, so that once an element is defined in a drawing, it does not need to be further defined and interpreted in subsequent drawings.

In the description of this application, it is necessary to indicate that the orientation or position relationship indicated by the terms "centre", "top", "bottom", "left", "right", "vertical", "horizontal", "inside", "outside", etc. are based on the orientation or position relationship shown in the drawings, or the orientation or position relationship that is routinely placed when the product of the invention is used so as to facilitate the description in the application, simplify the description, and not to indicate or imply that the device or component referred to must have a specific orientation, or construct and operate in a specific orientation. Therefore, it should not be understood as a restriction in this application. In addition, the terms "first", "second", "third", etc. are used only to distinguish between elements and cannot be understood as indicating or implying relative importance.

In the description of this application, it should also be stated that, unless otherwise expressly specified and defined, the terms "provide", "install", "connect", and "attach", etc. should be understood in a broad sense. For example, it can be a fixed connection, or a removable connection, or an integrated connection. For a person with ordinary technical skill in the art, the specific meaning of the above terms in this application should be understood on a case-by-case basis.

As described in the background technology, there are many complex problems with smart home devices in the existing technology. In view of this, the embodiment of this application provides a signal transmission circuit to simplify the circuit of the smart home devices by using a power supply line for supplying power and transmitting signal at the same time.

Figure 2:
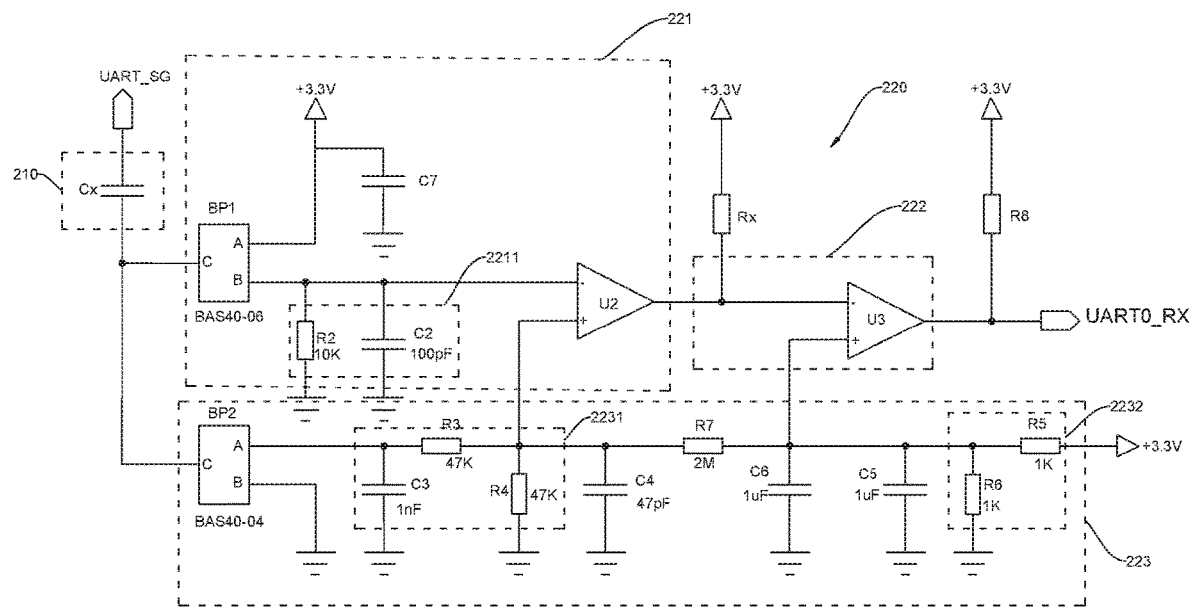
FIG. 2 is a circuit diagram of a demodulation circuit provided in an embodiment of the present application.

The following is an exemplary description of the signal transmission circuit provided in this application:

As an optional way of implementation, the signal transmission circuit is connected to a positive electrode of a direct current power supply line, the signal transmission circuit includes a modulation circuit 110 and/or a demodulation circuit 200. Referring to FIG. 1, the modulation circuit 110 includes a modulation chip U1, the modulation chip U1 is used to receive an input signal, generate a modulation signal according to the input signal, and output the modulation signal through the positive electrode of the power supply line. Referring to FIG. 2, the demodulation circuit 200 includes a direct current isolation unit 210 and a demodulation unit 220, the direct current isolation unit 210 is connected to the demodulation unit 220 and the positive electrode of the power supply line respectively, the direct current isolation unit 210 is used to isolate a direct current signal of the positive electrode of the power supply line, and output the modulation signal; the demodulation unit 220 is used to demodulate and output the modulation signal.

For a direct current power supply line, it includes positive electrode and negative electrode. When transmitting a signal, the positive electrode of the power supply line can be used for signal transmission.

At the same time, as a first way of implementation, the signal transmission circuit may include only the modulation circuit 110, the output end of the modulation circuit 110 is connected to the positive electrode of the direct current power supply line, modulation of a signal can be achieved through the modulation circuit 110, and the modulation signal is transmitted to the positive electrode of the power supply line. As a second way of implementation, the signal transmission circuit may include only the demodulation circuit 200, the input end of the demodulation circuit 200 is connected to the positive electrode of the direct current power supply line, and then the signal transmission circuit can receive the modulation signal transmitted through the power supply line and demodulate the modulation signal. As a third way of implementation, the signal transmission circuit may include both the modulation circuit 110 and the demodulation circuit 200 at the same time, through the signal transmission circuit, the modulation signal may be transmitted to other devices through the positive electrode of the direct current power supply line, or receive and demodulate a modulation signal transmitted from other devices through the positive electrode of the direct current power supply line.

Optionally, referring to FIG. 1 again, the modulation chip is a buffer driver with a three-state output function, and the modulation chip U1 of that model contains five pins, namely EN pin, IN pin, GND pin, VCC pin, and OUT pin, wherein, the EN pin is connected to the positive electrode of the direct current power supply line, the IN pin is used to input the modulation pulse signal, the GND pin is grounded, the VCC pin is used to connect to a power supply, and the modulated signal is output through the OUT pin. Among them, the power supply provided in the present application can be a 3.3V power supply to supply power to the modulation chip U1.

Of course, in some other embodiments, the modulation chip U1 can also be of other models, and is not limited in the present application.

As a way of implementation, in order to couple the modulation chip U1 to the power supply line, the modulation circuit 110 further includes a signal output unit 111, the signal output unit 111 is connected to an output end of the modulation chip U1, the signal output unit 111 is used to couple the modulation signal transmitted from the modulation chip U1 to the positive electrode of the power supply line.

Among them, the signal output unit 111 may include a first resistor R1 and a first capacitor C1, the first resistor R1 is connected in series with the first capacitor C1 and then connected to the output end of the modulation chip U1 and the positive electrode of the power supply line, respectively.

Understandably, the first resistor R1 is used for coupling, and the first capacitor C1 is used for coupling the modulation signal to the positive electrode of the power supply line.

Through the above implementation, it is possible to couple the modulation signal to the positive electrode of the power supply line, and thus it enables the transmission of modulation signal through the positive electrode of the power supply line, without the need to add an additional signal transmission line, thereby making the circuits of smart home devices simpler.

After coupling the modulation signal to the positive electrode of the power supply line and transmitting it through the positive electrode of the power supply line, an analysing device is also able to analyse the modulation signal from the signal of the positive electrode of the power supply line.

Among them, referring to FIG. 2, as a way of implementation, the direct current isolation unit 210 can be a direct current isolation capacitor, as another way of implementation, the direct current isolation unit 210 can be a transformer. The direct current isolation unit 210 can isolate the direct current at the positive electrode of the power supply line, and analyse the alternating current signal (i.e., the modulation signal) at the positive electrode of the power supply line, and then demodulate the modulation signal through the demodulation unit 220. Of course, as long as a device can achieve direct current isolation function, it can be used as a direct current isolation unit 210 provided in the present application.

Optionally, the demodulation unit 220 includes a demodulation module 221, a buffer module 222 and a reference voltage supply module 223, the demodulation module 221 is connected to the buffer module 222 and the reference voltage supply module 223 respectively, the buffer module 222 is also connected to the reference voltage supply module; wherein, the reference voltage supply module 223 is used to supply a reference voltage for the demodulation module 221 and the buffer module 222.

In the present application, the demodulation module 221 is used to demodulate the modulation signal, and the buffer module 222 is used to buffer and output the signal after demodulation. Of course, in a possible way of implementation, the demodulation unit 220 may include only the demodulation module 221 and the reference voltage supply module 223, and is not limited here.

Optionally, the demodulation unit 220 includes a first diode BP1, a first discharge loop 2211 and a first comparator U2, the first diode BP1 is connected to the direct current isolation unit 210, the first discharge loop 2211 and an inverting input end of the first comparator U2 respectively, the first diode BP1 is used to rectify a signal transmitted from the direct current isolation unit 210, a non-inverting input end of the first comparator U2 is connected to the reference voltage supply module 223, and an output end of the first comparator U2 is connected to the buffer module 222.

Among them, the first diode BP1 is used to rectify the modulation signal, so that the modulation signal is converted from alternating current to direct current, and is then transmitted to the non-inverting input end of the first comparator U2. Optionally, the first diode BP1 can be an ordinary diode, and, of course, the first diode BP1 can also be a Schottky diode.

When the first diode BP1 is an ordinary diode, the anode of the first diode BP1 is connected to the direct current isolation unit 210, and the cathode of the first diode BP1 is connected to the first discharge loop 2211 and the inverting input end of the first comparator U2 respectively. When the first diode BP1 is a Schottky diode, a first end of the first diode BP1 is connected to the direct current isolation unit 210, a second end of the first diode BP1 is connected to a power supply, a third end of the first diode BP1 is connected to the first discharge loop 2211 and the inverting input end of the first comparator U2 respectively. Furthermore, the first end of the first diode BP1 is a common anode port.

It should be noted that the power supply connected to the second end of the first diode BP1 can be a 3.3V power supply, in order to make the output of the power supply more stable, optional, the second end of the first diode BP1 is further connected to one end of a filter capacitor, the other end of the filter capacitor is grounded, by setting the filter capacitor, it can play the role of filtering the power supply. At the same time, by connecting the second end of the Schottky diode to the power supply, the effect of level clamping can also be achieved.

Optionally, the first discharge loop 2211 includes a second capacitor C2 and a second resistor R2, one end of the second resistor R2 is connected to the first diode BP1, another end of the second resistor R2 is grounded; one end of the second capacitor C2 is connected to the first diode BP1, another end of the second capacitor C2 is grounded. An RC discharge loop can be formed by setting the second capacitor C2 and the second resistor R2. Furthermore, the first comparator U2 can achieve demodulation of the modulation signal by comparing the voltages of the non-inverting input end and inverting input end.

Optionally, the reference voltage supply module 223 includes a second diode BP2 and a second discharge loop 2231, the second diode BP2 is connected to the second discharge loop 2231 and the direct current isolation unit 210 respectively, the second discharge loop 2231 is further connected to the non-inverting input end of the first comparator U2; wherein, the discharge time of the second discharge loop 2231 and the discharge time of the first discharge loop 2211 are different.

Among them, the second diode BP2 can also be an ordinary diode or a Schottky diode, when the second diode BP2 is an ordinary diode, the anode of the second diode BP2 is connected to the direct current isolation unit 210, the cathode of the second diode BP2 is connected to the second discharge loop 2231 and the non-inverting input end the first comparator U2 respectively. When the second diode BP2 is a Schottky diode, a first end of the second diode BP2 is connected to the direct current isolation unit 210, a second end of the second diode BP2 is connected to the second discharge loop 2231 and the non-inverting input end of the first comparator U2, and a third end of the second diode BP2 is grounded.

Moreover, the effect of level clamping can also be achieved by grounding the third end of the Schottky diode.

Since the discharge time of the first discharge loop 2211 is different from the discharge time of the second discharge loop 2231, the voltages of the non-inverting input end and the inverting input end of the first comparator U2 are not the same, so that the effect of demodulation of the modulation signal can be achieved by comparing the first comparator U2.

As a way of implementation, the second discharge loop 2231 includes a third capacitor C3, a third resistor R3 and a fourth resistor R4, one end of the third capacitor C3 is connected to the second diode BP1 and the third resistor R3, another end of the third capacitor C3 is grounded, one end of the third resistor R3 is connected to the second diode, another end of the third resistor R3 is connected to the non-inverting input end of the first comparator U2 and one end of the fourth resistor R4 respectively, another end of the fourth resistor R4 is grounded.

Understandably, the third capacitor C3, the third resistor R3, and the fourth resistor R4 actually also form an RC discharge loop. Furthermore, the discharge times of the second discharge loop 2231 and the first discharge loop 2211 mentioned in the present embodiment are different, thus rendering the first comparator U2 to demodulate the modulation signal according to the voltage input into the non-inverting input end and the inverting input end.

It should be noted that in an RC circuit, the product of a resistance value and a capacitance value is a time constant, and the smaller the time constant, the faster the discharge rate of the circuit. In other words, in order to make the discharge time of the first discharge loop 2211 different from the discharge time of the second discharge loop 2231, the parameter in the first discharge loop 2211 is not the same as the parameter in the second discharge loop 2231. For example, the resistance value of the second resistor R2 is 10K, the capacitance value of the second capacitor C2 is 100 pF, the capacitance value of the third capacitor C3 is 1 nF, the resistance value of the third resistor R3 is 47K, the resistance value of the fourth resistor R4 is 47K, and this makes the discharge time of the first discharge loop 2211 different from that of the second discharge loop 2231. Of course, in some other embodiments, the first discharge loop 2211 and the second discharge loop 2231 have other parameters or more components, and is not limited here, for example, the second discharge loop 2231 may also include a 47 pF capacitor, one end of the capacitor is connected to a non-inverting input end of the first comparator U2, the other end of the capacitor is grounded.

Among them, the buffer module 222 is used to buffer and output the signal transmitted from the first comparator U2, thereby making the signal more stable. As a way of implementation, the buffer module 222 includes a second comparator U3, the reference voltage supply module 223 includes a voltage division circuit 2232, a non-inverting input end of the second comparator U3 is connected to the output end of the first comparator U2, an inverting input end of the second comparator U3 is connected to the voltage division circuit 2232, and the voltage division circuit 2232 is further connected to a power supply, the voltage division circuit 2232 is used to provide a stable reference voltage for the non-inverting output end of the second comparator U3.

It should be noted that, in order to make the signal input at the non-inverting input end of the second comparator U3 more stable, the non-inverting input end of the second comparator U3 is further connected to a pull-up resistor, the pull-up resistor is further connected to a 3.3V power supply.

Optionally, the voltage division circuit 2232 includes a fifth resistor R5 and a sixth resistor R6, one end of the fifth resistor R5 is connected to the 3.3V power supply, another end of the fifth resistor R5 is connected to one end of the sixth resistor R6 and the inverting input end of the second comparator U3 respectively, another end of the sixth resistor R6 is grounded. By setting the voltage division circuit 2232, it is possible to use the voltage division principle to provide a stable reference voltage for the inverting input end of the second comparator U3.

Of course, in a possible way of implementation, other devices, such as a filter capacitor, may also be included in the voltage division circuit 2232, and is not limited in the present application.

Optionally, an isolation circuit is also included in the reference voltage supply module 223, two sides of an isolation resistor R7 are connected to the second discharge loop 2231 and the voltage division circuit 2232 respectively. Furthermore, the resistance value of the isolation resistor R7 is large, for example, the resistance value of the isolation resistor R7 is 2 M, so that the second discharge loop 2231 and the voltage division circuit 2232 are like open circuit, and the second discharge loop 2231 does not affect the voltage division circuit 2232, so that the circuit is more stable.

Based on the above implementation, the present application also provides a power supply line that includes the above-mentioned signal transmission circuit, in other words, the circuit can be integrated with the modulation circuit 110 and/or the demodulation circuit 200.

Figure 3:
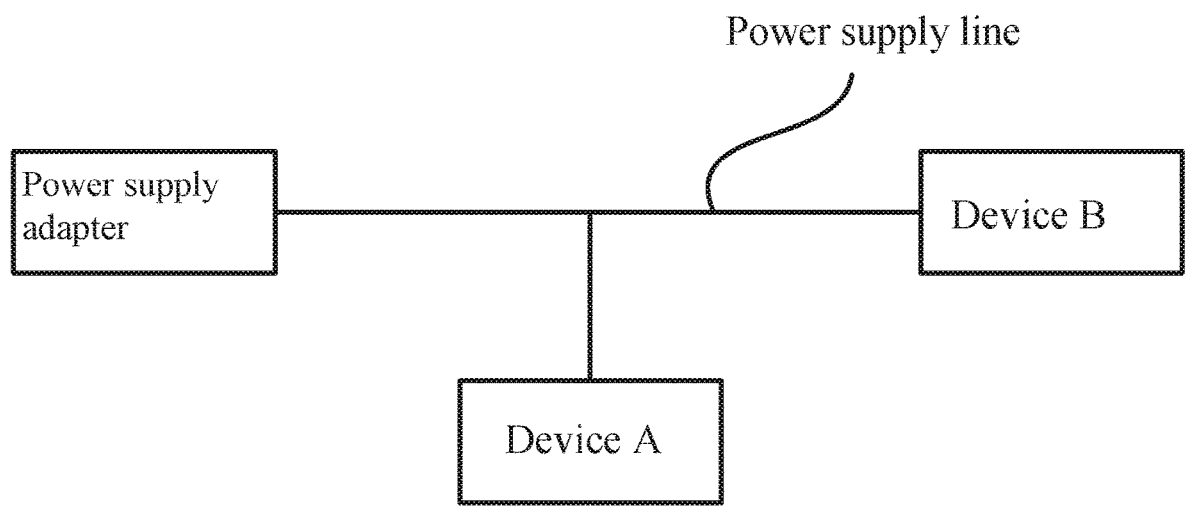
FIG. 3 is an illustrative diagram of connection between devices provided in an embodiment of the present application.

For example, referring to FIG. 3, when device A needs to obtain data from device B, device B is connected to a power supply via a power supply adapter, at this time only device A is needed to connect to the power supply line in order to collect data without the need of an additional data line, thereby making the circuit simpler.

As another way of implementation, the present application also provides a device that includes the above-mentioned signal transmission circuit.

Therefore, in the present application, when device A needs to obtain data from device B, as a first way of implementation, the modulation circuit 110 and the demodulation circuit 200 can be integrated simultaneously on the power supply line, on this basis, neither device A nor device B requires the integration of the modulation circuit 110 or the demodulation circuit 200. As a second way of implementation, only the modulation circuit 110 is integrated on the power supply line, on this basis, device B does not require integration of the modulation circuit 110, and device A is integrated with the demodulation circuit 200. As a third way of implementation, only the demodulation circuit 200 is integrated on the power supply line, on this basis, device B requires the integration of the modulation circuit 110, and device A does not require integration with the demodulation circuit 200.

In summary, the embodiment of the present application provides a signal transmission circuit, a power supply line and a device, the signal transmission circuit is connected to a positive electrode of a direct current power supply line, the signal transmission circuit includes a modulation circuit and/or a demodulation circuit, wherein, the modulation circuit includes a modulation chip, the modulation chip is used to receive an input signal, generate a modulation signal according to the input signal, and output the modulation signal through the positive electrode of the power supply line; the demodulation circuit includes a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal. Due to the adoption of a power supply line to realize signal transmission, therefore it is not necessary to have an additional signal line, making the circuit between devices simpler.

The above are only various embodiments of the present application, and the scope of protection of the present application is not limited to these embodiments, any skilled person familiar with the technical field can, within the scope of technology revealed in the present application, easily conceive of changes or replacements that should also be covered in the scope of protection of the present application. Therefore, the scope of protection of the present application shall be based on the scope of protection of the claims.

INDUSTRIAL PRACTICALITY

The embodiment of the present application provides a signal transmission circuit, a power supply line and a device, the signal transmission circuit is connected to a positive electrode of a direct current power supply line, the signal transmission circuit includes a modulation circuit and/or a demodulation circuit, wherein, the modulation circuit includes a modulation chip, the modulation chip is used to receive an input signal, generate a modulation signal according to the input signal, and output the modulation signal through the positive electrode of the power supply line; the demodulation circuit includes a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal. Due to the adoption of a power supply line to realize signal transmission, therefore it is not necessary to have an additional signal line, making the circuit between devices simpler.

What is claimed is:

1. A signal transmission circuit, characterized in that the signal transmission circuit is connected to a positive electrode of a direct current power supply line, the signal transmission circuit comprises a modulation circuit and/or a demodulation circuit, wherein,
   the modulation circuit comprises a modulation chip, the modulation chip is used to receive an input signal, generate a modulation signal according to the input signal, and output the modulation signal through the positive electrode of the power supply line;
   the demodulation circuit comprises a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal;
   wherein the demodulation unit comprises a demodulation module, a buffer module and a reference voltage supply module, the demodulation module is connected to the buffer module and the reference voltage supply module respectively, the buffer module is connected to the reference voltage supply module; wherein, the reference voltage supply module is used to supply a reference voltage for the demodulation module and the buffer module.

2. The signal transmission circuit as claimed in claim 1, characterized in that the demodulation module comprises a first diode, a first discharge loop and a first comparator, the first diode is connected to the direct current isolation unit, the first discharge loop and an inverting input end of the first comparator respectively, the first diode is used to rectify a signal transmitted from the direct current isolation unit, a non-inverting input end of the first comparator is connected to the reference voltage supply module, and an output end of the first comparator is connected to the buffer module.

3. The signal transmission circuit as claimed in claim 2, characterized in that the first discharge loop comprises a second capacitor and a second resistor, one end of the second resistor is connected to the first diode, another end of the second resistor is grounded; one end of the second capacitor is connected to the first diode, another end of the second capacitor is grounded.

4. The signal transmission circuit as claimed in claim 2, characterized in that the reference voltage supply module comprises a second diode and a second discharge loop, the second diode is connected to the second discharge loop and the direct current isolation unit respectively, the second discharge loop is further connected to the non-inverting input end of the first comparator; wherein, discharge time of the second discharge loop and discharge time of the first discharge loop are different.

5. The signal transmission circuit as claimed in claim 4, characterized in that the second discharge loop comprises a third capacitor, a third resistor and a fourth resistor, one end of the third capacitor is connected to the second diode and the third resistor, another end of the third capacitor is grounded, one end of the third resistor is connected to the second diode, another end of the third resistor is connected to the non-inverting input end of the first comparator and one end of the fourth resistor respectively, another end of the fourth resistor is grounded.

6. The signal transmission circuit as claimed in claim 2, characterized in that the buffer module comprises a second comparator, the reference voltage supply module comprises a voltage division circuit, a non-inverting input end of the second comparator is connected to the output end of the first comparator, an inverting input end of the second comparator is connected to the voltage division circuit, and the voltage division circuit is further connected to a power supply.

7. The signal transmission circuit as claimed in claim 6, characterized in that the voltage division circuit comprises a fifth resistor and a sixth resistor, one end of the fifth resistor is connected to the power supply, another end of the fifth resistor is connected to one end of the sixth resistor and the inverting input end of the second comparator respectively, another end of the sixth resistor is grounded.

8. The signal transmission circuit as claimed in claim 1, characterized in that the direct current isolation unit comprises a direct current isolation capacitor.

9. The signal transmission circuit as claimed in claim 1, characterized in that the direct current isolation unit comprises a transformer.

10. A power supply line, characterized in that the power supply line comprises the signal transmission circuit as claimed in claim 1.

11. A device, characterized in that the device comprises the signal transmission circuit as claimed in claim 1.

12. A signal transmission circuit, characterized in that the signal transmission circuit is connected to a positive electrode of a direct current power supply line, the signal transmission circuit comprises a modulation circuit and/or a demodulation circuit, wherein, the modulation circuit comprises a modulation chip, the modulation chip is used to receive an input signal, generate a modulation signal according to the input signal, and output the modulation signal through the positive electrode of the power supply line;

the demodulation circuit comprises a direct current isolation unit and a demodulation unit, the direct current isolation unit is connected to the demodulation unit and the positive electrode of the power supply line respectively, the direct current isolation unit is used to isolate a direct current signal of the positive electrode of the power supply line, and output the modulation signal; the demodulation unit is used to demodulate and output the modulation signal; wherein the modulation circuit further comprises a signal output unit, the signal output unit is connected to an output end of the modulation chip, the signal output unit is used to couple the modulation signal transmitted from the modulation chip to the positive electrode of the power supply line, characterized in that the signal output unit comprises a first resistor and a first capacitor, the first resistor is connected in series with the first capacitor and then connected to the output end of the modulation chip and the positive electrode of the power supply line respectively.

\* \* \* \* \*